US008872106B2

(12) United States Patent
Nishihama et al.

(10) Patent No.: US 8,872,106 B2
(45) Date of Patent: Oct. 28, 2014

(54) PATTERN MEASURING APPARATUS

(71) Applicant: Hitachi High-Technologies Corporation, Tokyo (JP)

(72) Inventors: Hiroshi Nishihama, Hitachinaka (JP); Tatsuya Maeda, Hitachinaka (JP); Mitsuji Ikeda, Hitachinaka (JP); Susumu Koyama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/789,346

(22) Filed: Mar. 7, 2013

(65) Prior Publication Data

US 2014/0021350 A1     Jan. 23, 2014

(30) Foreign Application Priority Data

Jul. 20, 2012   (JP) .................................. 2012-161107

(51) Int. Cl.
H01J 37/00    (2006.01)
H01J 37/26    (2006.01)

(52) U.S. Cl.
CPC ...................................... H01J 37/26 (2013.01)
USPC ............ 250/310; 250/306; 250/307; 250/311

(58) Field of Classification Search
USPC ................... 250/306, 307, 310, 311
See application file for complete search history.

(56) References Cited

U.S. PATENT DOCUMENTS

| | | | |
|---|---|---|---|
| 6,872,943 B2 * | 3/2005 | Takane et al. ................. | 250/310 |
| 8,063,363 B2 | 11/2011 | Yeh et al. | |
| 8,461,527 B2 * | 6/2013 | Nakahira et al. .............. | 250/310 |
| 8,497,475 B2 | 7/2013 | Yeh et al. | |
| 2004/0222375 A1 * | 11/2004 | Kimura et al. ................ | 250/310 |
| 2005/0285034 A1 * | 12/2005 | Tanaka et al. ................. | 250/310 |
| 2011/0147586 A1 | 6/2011 | Fukuda et al. | |

FOREIGN PATENT DOCUMENTS

| | | | |
|---|---|---|---|
| JP | 2004-251674 A | 9/2004 | |
| JP | 2006-332069 A | 12/2006 | |
| JP | 4996206 B2 | 8/2012 | |

OTHER PUBLICATIONS

United States Notice of Allowance issued in U.S. Appl. No. 13/789,323 dated Aug. 20, 2013.

* cited by examiner

Primary Examiner — Michael Maskell
(74) Attorney, Agent, or Firm — McDermott Will & Emery LLP

(57) ABSTRACT

An object of the present invention is to provide a pattern measuring apparatus which performs high-accuracy concavity/convexity determination (e.g., distinguishing between a line segment and space) while simultaneously reducing the dose of a beam falling onto a pattern to be measured. To attain the object, this invention proposes a pattern measuring apparatus which specifies a pattern in a measurement object area by scanning a tilted beam with respect to another area different from the measurement object area and then performs measurement based on the pattern-specifying result. With such arrangement, it becomes possible to perform measurement without the risk of wrong pattern designation while lowering the dose of a beam hitting the measurement object area.

10 Claims, 12 Drawing Sheets

PICTORIAL DIAGRAM OF SADP
PROCESS PATTERN CROSS-SECTION

NO TILT

TILT = −θ

TILT = +θ

FOCUS POSITION CORRECTION TABLE 1504

| Δx(nm) | FOCUS POSITION CORRECTION AMOUNT |
|---|---|
| -1500 | 100 |
| -1450 | 90 |
| -1400 | 81 |
| -1350 | 69 |
| ⋮ | ⋮ |
| 0 | 0 |
| 50 | -9 |
| 100 | -12 |
| ⋮ | ⋮ |
| 1350 | -71 |
| 1400 | -79 |
| 1450 | -90 |
| 1500 | -101 |

PATTERN MEASURING APPARATUS

BACKGROUND OF THE INVENTION

The present invention relates generally to pattern measuring apparatus which perform pattern measurement based on pattern concavity/convexity determination or the like, and more particularly to a pattern measuring apparatus that performs pattern identification of line segments and gap spaces formed on a semiconductor wafer.

A scanning electron microscope (SEM) is one form of charged particle beam apparatus, which enables observation of fine objects. The SEM has a variety of applications, including measurement and inspection of circuit patterns that make up highly integrated semiconductor devices. Incidentally, with recent advances in miniaturization of semiconductor devices, circuit patterns increase in integration density. In particular, this has often led to appearance of ultrafine circuit patterns, known as line-and-space patterns having successive line patterns, wherein lines and gap spaces are hardly distinguishable from each other in interval or pitch. Additionally, with advances in semiconductor microfabrication technology, observation images of a line and space are becoming more similar in look to each other.

An increase in visual similarity of line and space results in the risk that one of them is mistaken for the other. More specifically, even when an image was acquired in order to measure the width of a line, it can happen in practice that the width of a space is measured by mistake. Japanese Patent Literature JP-A-2004-251674 (its corresponding United States Patent Application Publication is US 2004-A-0222375) discloses therein a technique for distinguishing between line and space portions on the basis of expansion of hem parts of a plurality of peaks contained in a differential waveform of a profile, which has been obtained by applying projection processing to an image acquired. However, sensed images tend to decrease in contrast due to further miniaturization in recent years; so, it is difficult in some cases to extract the difference in brightness of hem parts of profile peaks. Once peaks overlap each other, discrimination can be failed.

JP-A-2006-332069 (its corresponding United States patent is U.S. Pat. No. 6,872,943) discloses a technique for performing concavity/convexity determination with high accuracy by irradiating a tilted beam and emphasizing a difference between peaks of two, right and left edges of a line.

SUMMARY OF THE INVENTION

The techniques as disclosed in the above-cited Patent Literatures are to enable distinction of lines and spaces that have traditionally been difficult to be distinguished over each other. Especially, the technique taught by JP-A-2006-332069 is capable of emphasizing a difference between the right and left edges of a line, thus making it possible to enhance the success rate of concavity/convexity determination. However, as the beam is irradiated obliquely with respect to the pattern being measured, an image to be obtained by such beam irradiation is an oblique image, which is unsuitable for use in accurate measurement of pattern sizes. Although it is also permissible to perform size measurement by scanning a beam for the measurement use (beam with no tilt) after having completed the concavity/convexity determination, a need is felt to apply to the pattern under measurement both the beam scanning for concavity/convexity determination and the beam scanning for size measurement.

By taking into consideration the adhesion of electrification charge due to beam irradiation and pattern shrink, it is desirable that the beam irradiation onto the measurement object pattern stay less. Proposed below is a pattern measuring apparatus capable of performing high-accuracy concavity/convexity determination (e.g., line/space distinction) while at the same time suppressing the irradiation amount of a beam falling onto a pattern under measurement.

To attain the foregoing object, in accordance with one aspect of this invention, a pattern measuring apparatus is provided which specifies a pattern in an object area under measurement by scanning a tilted beam with respect to an area different from the measurement object area and executes measurement based on the specified result.

With the arrangement stated above, it becomes possible to perform measurement without the risk of wrong pattern designation while simultaneously lowering the dose of a beam hitting the measurement area.

Other objects, features, and advantages of the present invention will become apparent from the following description of embodiments of the present invention provided in relation to the accompanying drawings.

DESCRIPTION OF THE EMBODIMENTS

Figure 1:
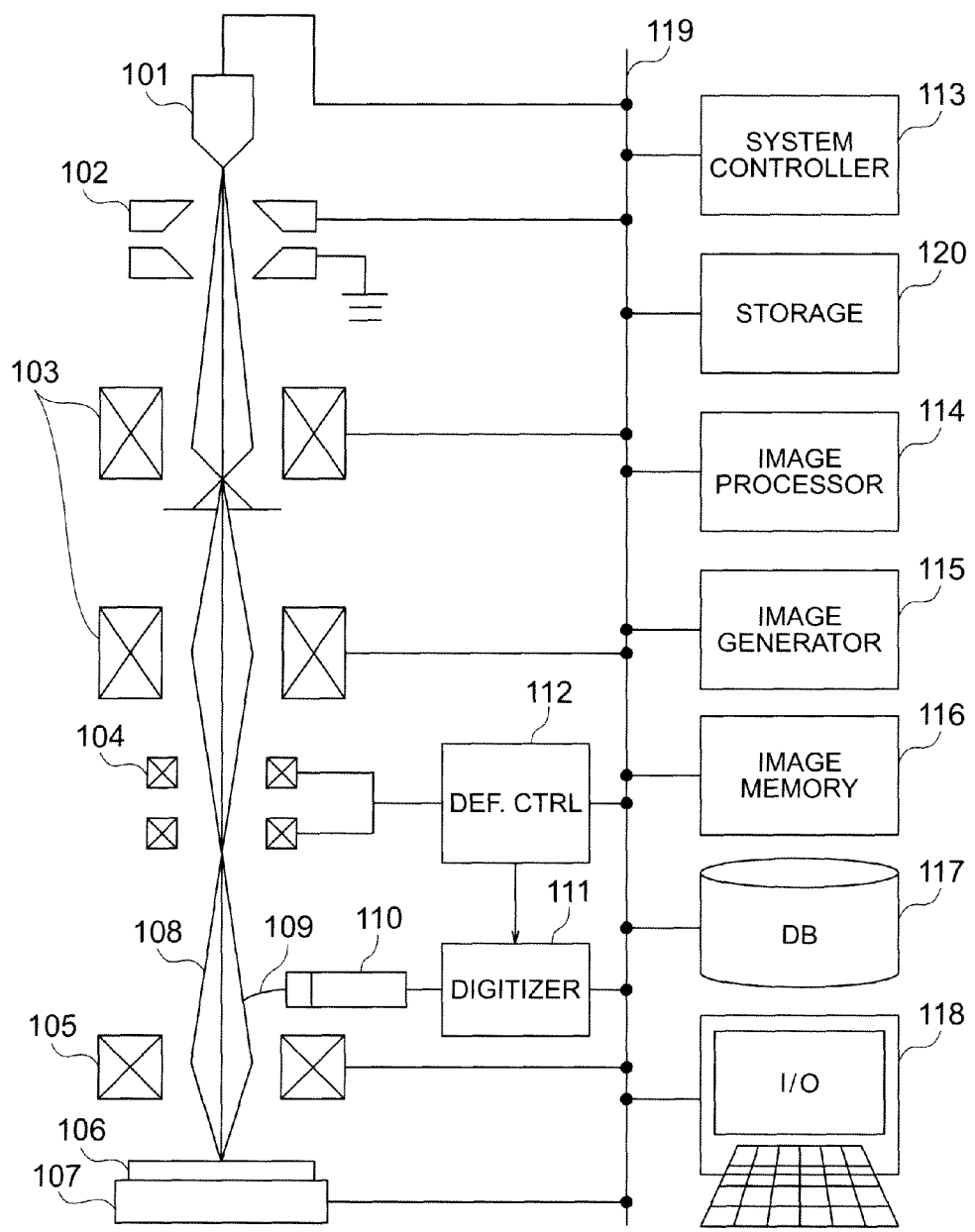
FIG. 1 is a diagram showing one example of a scanning electron microscope (SEM).

An explanation will now be given below of an apparatus for measuring pattern sizes by using either image data obtained by an image sensing device or waveform data, examples of which apparatus include a pattern measuring apparatus that executes desired measurement by accurately specifying a target pattern to be measured.

A scanning electron microscope (SEM) which irradiates an electron beam onto a semiconductor circuit pattern and detects secondary electrons to be derived therefrom to thereby evaluate the shape of a circuit pattern that is the object of interest will be described below as an example of the image sensor device, although other charged particle beam devices, such as a focused ion beam (FIB) device or like equipment, may alternatively be employed as the imager device.

Embodiment 1

In the embodiment below, an example will be described which tilts an electron beam within an area different from the measurement object (i.e., area unused for length measurement) in the process of acquiring a length measurement image that is subjected to pattern measurement and uses the information to be obtained based on irradiation of such tilted beam to perform concavity/convexity determination. By the beam tilting, the electron beam is caused to hit one side-wall of a circuit pattern rather than its top surface; so, this sidewall increases in width of white band when compared to top-down images. As the white band varies in width in a way depending on a tilt angle of the electron beam, it becomes easier to specify an edge on one side with the white band getting thick. A sidewall onto which the electron beam is irradiated is a sidewall of convex portion. Thus, if this edge is specifiable, it becomes possible to specify the positions of convex and concave portions with respect to this edge.

More concretely, in the case of tilting the beam by using the swing-back action of an objective lens, it is understood that when the sidewall is used as a reference, a convex part (line) is positioned in the beam swing-back direction for beam tilt whereas a concave part (space) is placed in the reverse direction to the swingback direction. In this embodiment, the concavity/convexity determination is achieved by evaluation of the electron beam's tilt angle and the extensity of the white band at that time. Additionally, in areas used for circuit pattern length measurement, it is possible to perform length measurement with high accuracy because image pickup is done in the state that the tilt angle is returned to vertical beam angle.

In accordance with the embodiment explained below, the line-and-space concavity/convexity determination is carried out by irradiating a tilted electron beam with respect to an area which is not used for length measurement whereby it becomes possible to achieve high-accuracy line-and-space concavity/convexity determination in a short period of time, which is substantially the same as an image pickup time consumed to simply sense a length measurement image.

In addition, it is no longer necessary to perform a plurality of scanning operations with the tilt angle varied. Thus, the irradiation amount or "dose" of the electron beam is lowered. This makes it expectable to reduce chargeup and shrink of a sample, also known as workpiece. The intended image is acquirable by a single scan. It is thus unnecessary to execute positioning between an oblique image and length measurement image. This makes it possible to perform the concavity/convexity determination in a simple and easy manner.

Practical embodiments will be described in detail with reference to the accompanying drawings below.

(Overview of Scanning Electron Microscope)

An explanation will first be given of a scanning electron microscope (SEM) in accordance with one embodiment of the invention. As shown in FIG. 1, the SEM of this embodiment is generally made up of various system components including, for example, an electron source 101 which irradiates a primary electron beam 108 onto a workpiece wafer 106, an acceleration electrode 102, a focusing lens 103, a deflector 104, an objective lens 105, a detector which performs sampling of an emission electron signal 109 to be generated from the sample wafer 106 to thereby acquire a digital image, a digitizer 111, an image memory 116 which stores therein the acquired digital image and performs displaying or processing, an input/output (I/O) unit 118, an image generation unit 115, an image processing unit 114, a system control unit 113, a result storage unit 120, and a database (DB) module 117 for storage of recipe data, called the recipe unit 117. It should be noted that in the explanation below, a main operational constituent that performs concavity/convexity determination and length measurement or the like will also be called the arithmetical unit.

The electron source 101 is the one that emits a primary electron beam 108. The acceleration electrode 102 is for accelerating primary electrons. The focusing lens 103 is to perform focusing of the primary electron beam. The deflector 104 performs two-dimensional (2D) scanning deflection of primary electrons. The objective lens 105 focuses primary electrons onto the sample wafer 106. A stage 107 is for stably mounting the sample thereon. The detector 110 detects an emission electron signal 109 of secondary electrons generated from the sample. The digitizer 111 digitizes a detected signal. A deflection control unit 112 controls a deflection amount or the like in the deflector. Respective ones of these components are connected to the system control unit 113 via a bus 119.

The pattern measuring apparatus have other components, including the image memory 116 for storage of image data, the image generator 115 that performs image creation processing, the image processing unit 114 that performs processing of an image acquired, the recipe unit 117 that stores a recipe(s) containing therein inspection conditions, data entry devices for giving instructions to the device, such as a keyboard and a pointing device called the mouse, the I/O unit 118 made up of a display monitor and/or a printer for outputting data from the device, and the result storage unit 120 for storing measurement and inspection results. These components are interconnected together by the bus 119.

This embodiment device also functions to form a profile based on detected secondary electrons or reflection electrons or else. This profile is formed by execution of projection processing based on an electron detection quantity at the time of performing one-dimensional (1D) or two-dimensional (2D) scanning of primary electrons or based on brightness information of an acquired image. The profile obtained is for use in size measurement of patterns fabricated on a semiconductor wafer, for example.

Figure 8:
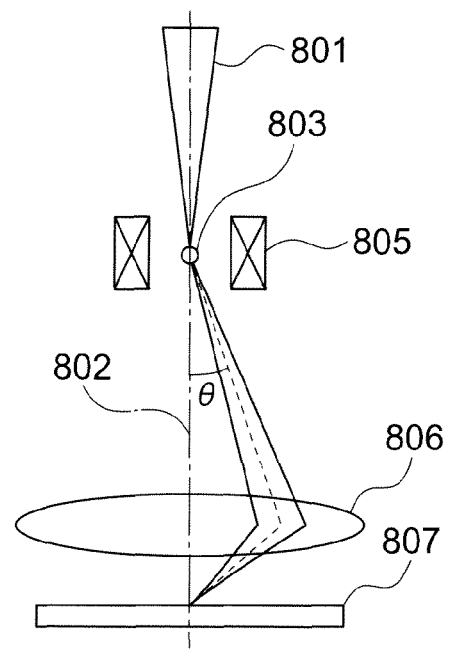
FIG. 8 is a diagram showing a beam locus upon irradiation of a tilted beam.

The SEM of this embodiment further includes a beam tilting deflector 805 shown in FIG. 8, which is provided for irradiating an electron beam while obliquely inclining or tilting the beam with respect to its ideal light axis 802 (i.e., the loci of a beam that is not deflected). The beam tilting deflector 805 serves to deflect an electron beam 801 at an object point 803 of the objective lens 806 to thereby change the angle of an arrival point at which the electron beam 801 falls onto sample 807. The electron beam 801 that was deflected by the beam tilting deflector 805 to the right side of a drawing sheet is defected again toward the ideal light axis 802 by the swingback action of objective lens 806. By letting the object point 803 be a deflection support point, it becomes possible to irradiate the electron beam 801 at an intersection point of the sample 807's surface and the ideal light axis 802.

(SEM Image Acquisition)

Next, SEM image acquisition in the embodiment device will be explained with reference to FIG. 1. Acquisition of an image is such that several conditions are set up in conformity with the recipe that was taken out of the recipe unit 117; then, digital image data is acquired. The processing for image acquisition is as follows.

Firstly, the electron source 101 emits primary electron beam 108, which is accelerated by the acceleration electrode 102. Subsequently, rays of this beam are gathered together by the focusing lens 103, deflected by the deflector 104, and thereafter focused again by the objective lens 105 to fall onto the sample wafer 106 at a target location on the top surface thereof. By the irradiation of this primary electron beam 108, an emission electron signal 109 is generated from the sample surface, the intensity of which signal is detected by the detector 110 and is then converted by the digitizer 111 into a digital image signal.

The signal as output from the digitizer 111 is sent to the image generator unit 115, which performs processing including pixel multiplication, digital filtering and others, thereby providing processed digital image data which is stored in the image memory 116.

Then, at the image processor unit 114, frame addition-average processing is applied to the digital image data as read out of the image memory 116 in a manner that one input line is processed at a time.

Additionally, by irradiating the electron beam while simultaneously tilting it by the beam tilting deflector 805 shown in FIG. 8, it is possible to acquire an oblique image of the sample. In this embodiment device, an area that is not used for length measurement is acquired in a slanted manner at the time of sensing a length measurement image. This oblique area is used for the line-and-space concavity/convexity determination.

Figure 2:
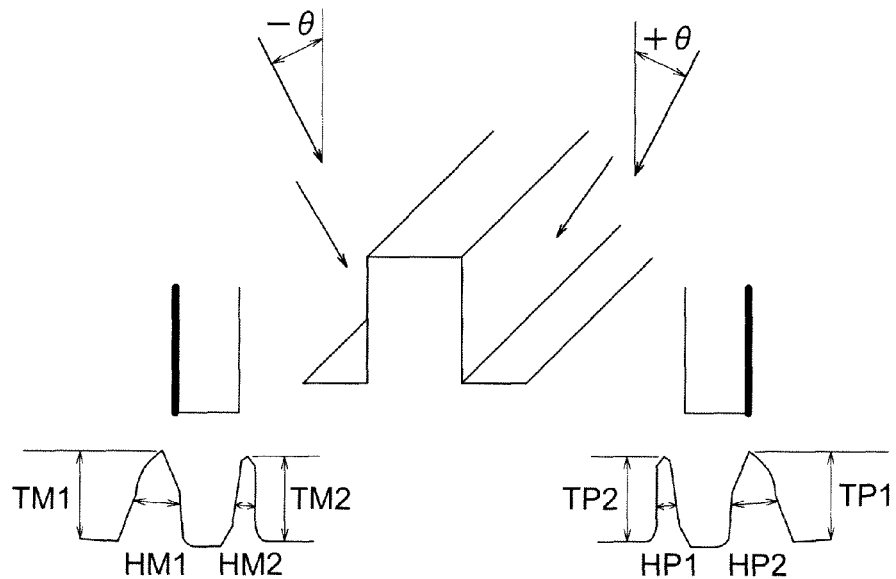
FIG. 2 is a diagram showing a profile change in the case of a protrusion is image-sensed from the direction of ±θ.

FIG. 2 shows a profile change in the case of a convex portion being image-sensed from a direction of +θ or −θ. Here, a half-value width of projection in the direction of +θ is represented by HP1, HP2; a half-value width of projection in the direction of −θ is given as HM1, HM2. In the case of image pickup being performed from the −θ direction, the half-value width HM1 of a signal of an edge portion on the left side becomes greater; in the case of image pickup being done from +θ direction, the half-value width HP2 of a signal of an edge on the right side becomes larger. Although in this embodiment the half-value width of a peak is used as the reference, this is not to be construed as limiting the invention. Any position of the peak may be used therefor as far as it increases or decreases in length depending on the tilting of the electron beam.

As the half-value width of an edge signal in the image pickup direction becomes larger in this way, use of this phenomenon makes it possible to achieve the line-and-space concavity/convexity determination based on an increase or decrease of the half-value width.

More specifically, when the width of a profile that was obtained by tilting the electron beam with respect to its light axis increases in the electron beam scanning direction, it is decidable that a portion with formation of a sidewall (edge) in the electron beam tilting direction exists at a location corresponding to the profile. In other words, when the measured extensity of a detection signal in the linear scan direction (i.e., X direction in the case of 2D scanning) becomes larger than that in the case of irradiating the electron beam along its light axis, it is determinable that an edge surface exists on the electron beam tilt direction side. Conversely, when the width of the profile becomes smaller, it is determinable that the object of interest is a portion corresponding to a rear surface (opposite side) when viewing from the tilt direction of the electron beam. That is to say, it can be seen that in cases where one of two peaks appearing in the event of obliquely scanning the electron beam becomes larger in width whereas the other becomes smaller, either a concave or convex portion exists therebetween. Additionally in this state, when a peak with its increasing width exists on the electron beam tilt side, it is decidable that a concave portion is present; when a peak with its decreasing width exists on the electron beam tilt side, a convex portion exists.

Figure 3:
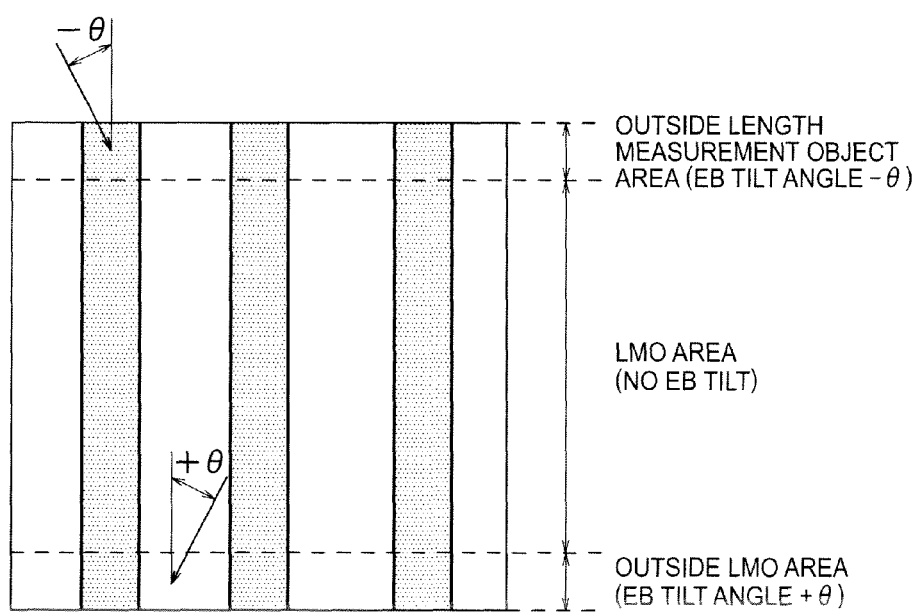
FIG. 3 is a diagram showing a positional relationship between an area of an image used for length measurement and an oblique image area in the case of the oblique image being acquired while performing image pickup of the length measurement-use image.

A further feature of this embodiment is that image pickup is performed while moving the tilt direction relative to an image region which is not used for length measurement of the sample as shown in FIG. 3 to thereby acquire an oblique image and a length measurement image simultaneously, the oblique image being for use in the line-and-space concavity/convexity determination stated supra.

In accordance with this embodiment, there is no need to perform repeatedly the scanning for concavity/convexity determination and the scanning for length measurement. This suppresses the irradiation amount or "dose" of such electron beam. Thus it is possible to reduce damage to the sample.

Figure 5:
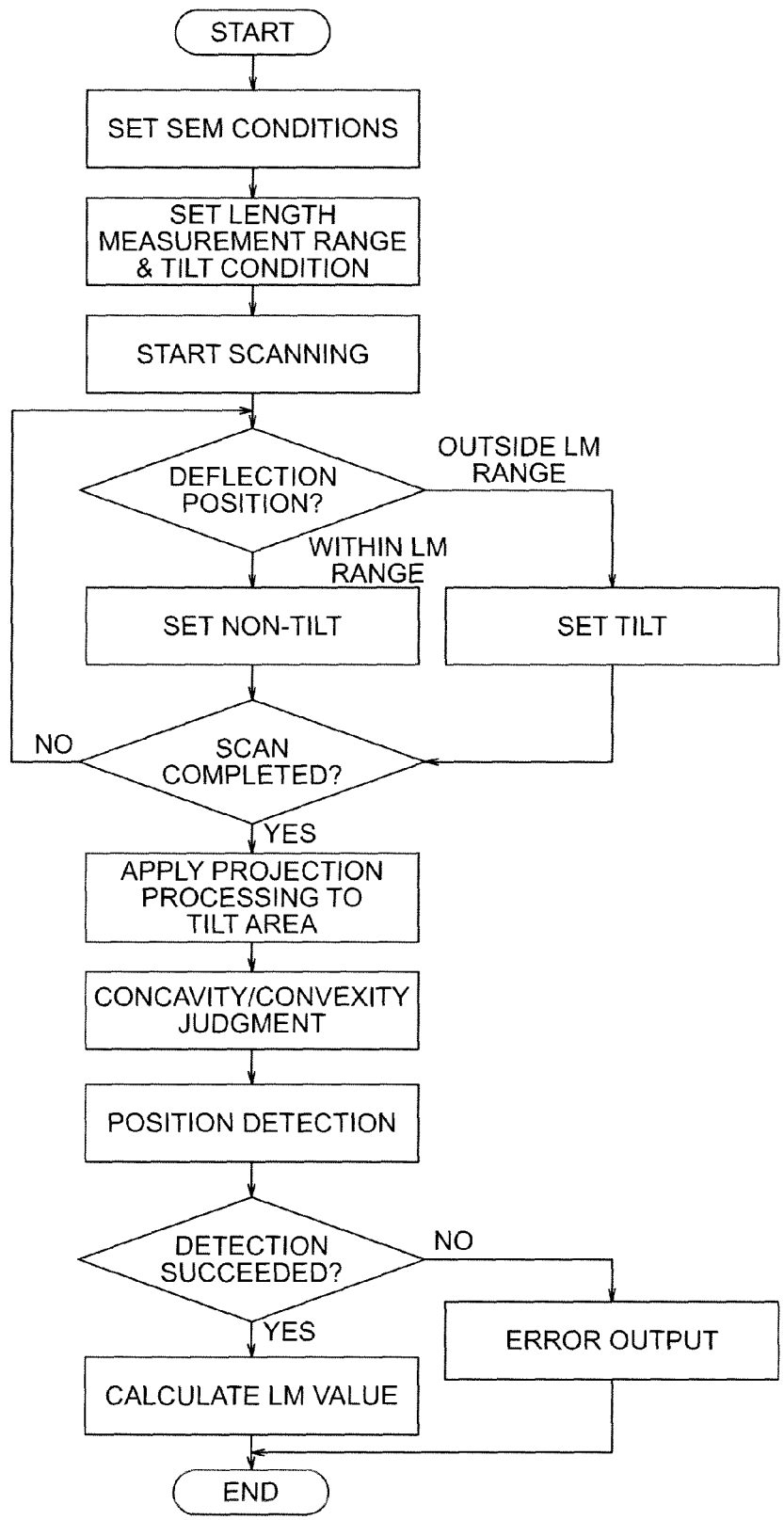
FIG. 5 is a flow chart showing a measurement process including a concavity/convexity determination step.

FIG. 5 is a flow diagram of one exemplary automated measurement process. First, SEM conditions are set up (at step 501). Examples of the SEM conditions as used herein include optical conditions, such as an electron beam acceleration voltage, beam current and so forth, and measurement object portion (coordinate) information. Then, a length measurement range and tilting condition are set (at step 502). In cases where one frame is designed to contain a mixture of the length measurement object area and concavity/convexity determination area (this is not the length measurement object area), both ranges are set in such a way as to ensure achievement of a signal amount needed for the length measurement and establishment of a signal amount enabling successful execution of the concavity/convexity determination. Next, beam scanning is carried out within a range including the measurement object portion being set up (step 503). For the concavity/convexity determination area, tilt scanning is performed (step 504). For the region that is set as the length measurement object area, normal scanning without tilting is performed to form a top-down image (step 505).

After having completed the scanning stated above, the arithmetical unit executes concavity/convexity determination based on the information extracted from a tilted-beam irradiation area and the above-stated judgment criterion (at step 506, 507). Checking whether or not the concavity/convexity determination is succeeded is as follows: a white band (peak) value of a sidewall opposing the beam coming from the beam tilt direction (swing-back direction by means of the objective lens), for example, is compared with a predetermined value; when the former is greater than or equal to the latter, a decision of success is made. This decision of successful completion of the concavity/convexity determination may alternatively be made in the case of a peak value difference from a sidewall on the opposite side is larger than or equal to a prespecified value. Still alternatively, in case the beam is tilted in different directions, one of which is for an upper side region of the length measurement object area and the other of which is for a lower side region thereof as shown in FIG. 3, the decision that the concavity/convexity determination was succeeded may be made when it is verified that both of them are in success. Additionally, in the case of a pattern being formed obliquely, the peak width of one edge increases from time to time without regard to the tilt direction as an example; if this is the case, the concavity/convexity determination may be performed by also taking into account the increased width size or "fatness" of such edge of the length measurement object area. In this case, the system may be arranged to perform either concavity/convexity determination or pattern inclination determination by reference to the edge data of length measurement object area when a difference in width between the right and left edges of length measurement object area is greater than or equal to a predetermined value.

In case it is decided that the concavity/convexity determination was completed successfully, a length measurement value is calculated based on a preset measurement condition (at step 508). For example, if the measurement condition is to measure the width of a line pattern, then measure the size of a distance between edges of this pattern. In this case, a length measurement box is set at both edges of the pattern to be measured; then, measure a peak-to-peak distance of brightness profile within the box.

In the case of the concavity/convexity determination being judged to be in fail, an error message is issued to prompt a system operator(s) to make a decision as to what kind of action should be taken thereafter (step 509).

Figure 4:
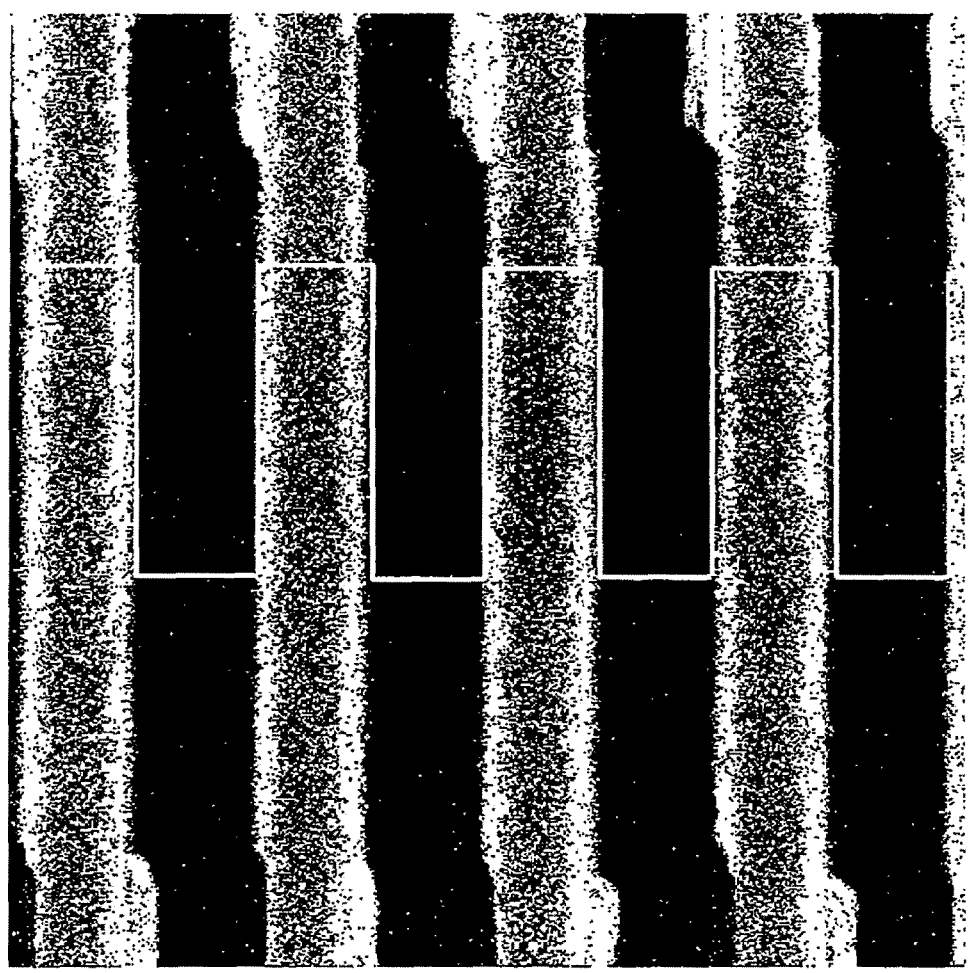
FIG. 4 is a diagram showing an example in which an oblique image and a length measurement-use image are contained in one display screen image.

A result of superposition of a concavity/convexity determination profile and acquired image is shown in FIG. 4. As shown herein, an image is acquired by switching between the tilted scanning and non-tilted scanning within one frame whereby the information required for the concavity/convexity determination and the information needed for measurement are to be included in a single image (i.e., image signal included in one frame). Thus, it becomes possible to reduce the risk of designating a wrong measurement object. It is also possible in a post verification event to check whether the correct measurement object is selected by just seeing a single display screen.

The switching between the tilted beam irradiation state and normal beam irradiation state based on the beam deflection at a locking position is executable by turn-on/off control of the beam tilting deflector—theoretically, no appreciable irradiation position is moved. Thus, it is possible to minimize the risk of pattern selection mistake.

Owing to the ability to achieve the concavity/convexity determination using one frame information, there is no need to perform multiple scanning operations. It is thus possible to prevent throughput degradation while at the same time suppressing pattern shrink due to excessive beam irradiation. This makes it expectable to improve the reproducibility of length measurement.

Embodiment 2

Figure 9:
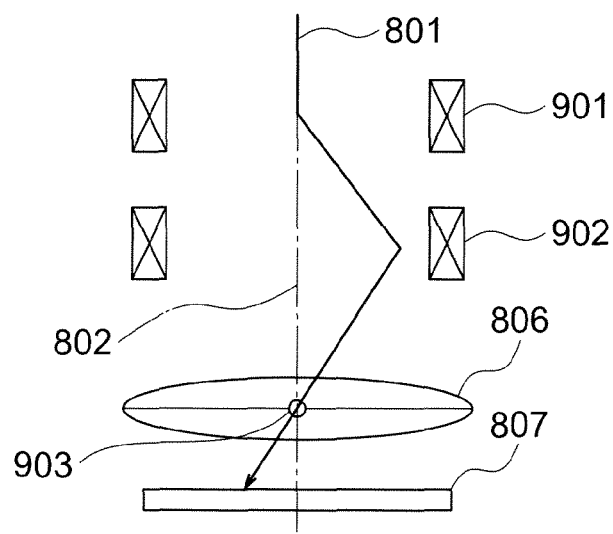
FIG. 9 is a diagram showing a beam locus when a field of view is moved from the ideal light axis.

An explanation will next be given of an example which performs concavity/convexity determination of a workpiece or sample wafer by a technique other than the beam tilt method, which utilizes the swing-back action of an objective lens. FIG. 9 is a diagram showing part of an optics system of SEM including a couple of scrolling deflectors 901 and 902. Although these scrolling deflectors 901-902 are for deflecting a beam while letting an intersection of a principal plane of objective lens 806 and an ideal light axis 802 be a supporting point of deflection, another arrangement may be employed which supplies the deflector with a signal with superimposition of a 2D beam scanning signal to thereby perform the view field movement and the deflection for beam scanning. Alternatively, the scanning deflector 104 and the scrolling deflectors 901-902 may be provided separately.

Figure 10:
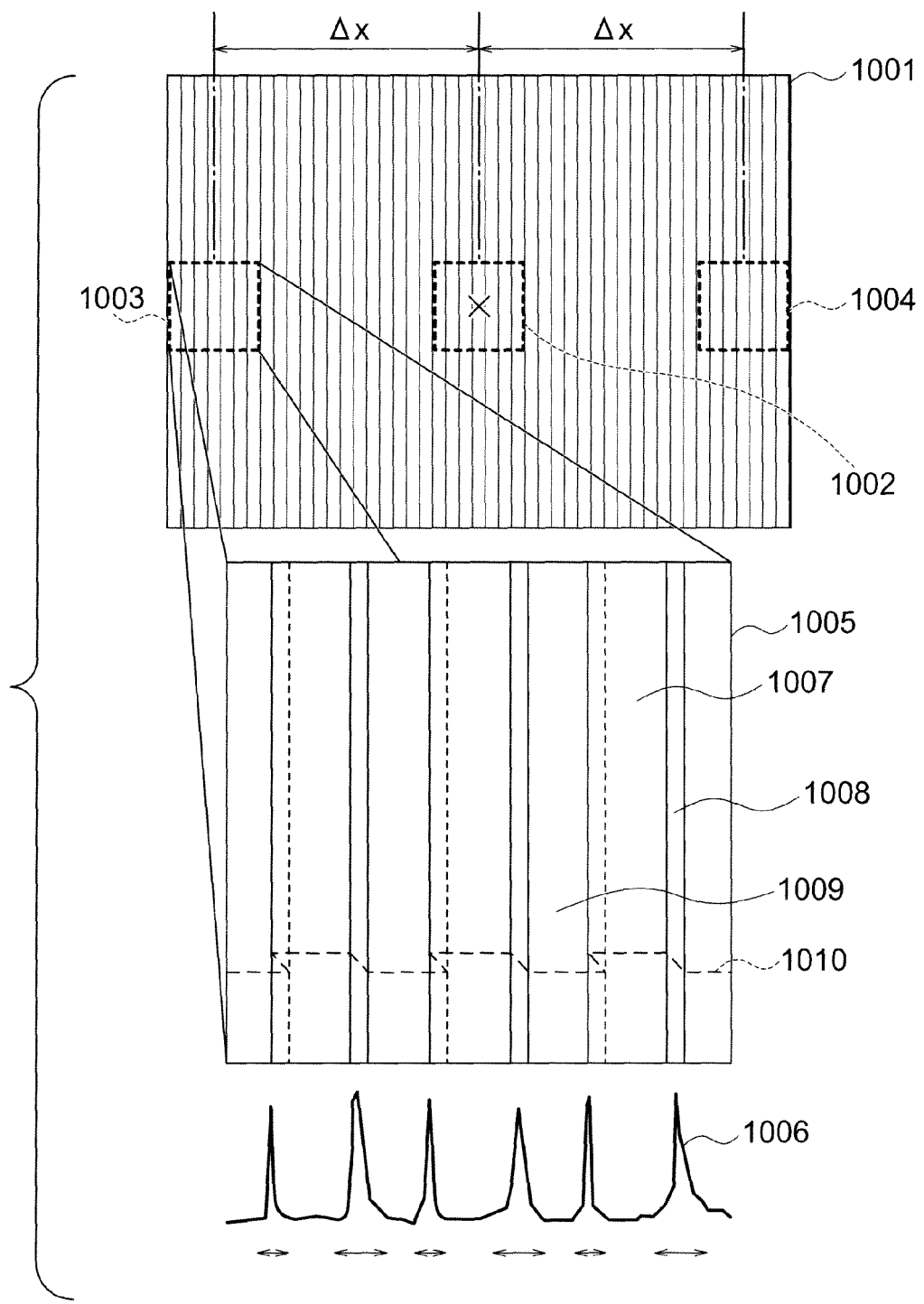
FIG. 10 is a diagram showing an example having a concavity/convexity determination area and a length measurement area within a line-and-space pattern formation area.

FIG. 10 is a diagram showing an example with setup of a length measurement object area 1002 and concavity/convexity determination area 1003 in a line pattern fabrication region 1001. Positioning is performed by means of the sample stage in such a manner that the light axis of an electron beam coincides with the coordinates of a central point of the length measurement object area 1002, then causing a visual field to move from such state by a distance Δx. In the case of such view movement, also known as scrolling, deflection is performed with the intersection of the objective lens's principal plane and ideal light axis being as the deflection support point as in the example shown in FIG. 9. Thus, the beam behaves to obliquely fall onto the sample at an angle formed with the sample surface as shown in FIG. 9. In this embodiment the concavity/convexity determination is executed by utilizing this tilted state.

In the example of FIG. 10, the concavity/convexity decision area 1003 includes three line patterns 1007 as shown in a magnified image 1005. Among these three line patterns, there are space portions 1009, e.g., trench-like grooves. Due to the tilted beam irradiation, the image is in the state that sidewalls 1008 of the line patterns are visible. This image is used to prepare a brightness profile 1006, resulting in sidewall edges (sidewalls 1008) in the opposite direction to the view movement direction being seen to be thick. Thus, it becomes possible to perform the concavity/convexity determination of a pattern(s) included in the concavity/convexity decision area 1003 based on the brightness profile prepared. Furthermore, the positional precision of such view movement by electromagnetic deflection or electrostatic deflection is very high; so, it is possible to perform deflection of Δx accurately. Consequently, when the concavity/convexity determination is executable in the concavity/convexity decision area 1003, it is possible to specify a convexo-concave surface configuration 1010 of patterns included in the length measurement object area 1002 that lies beyond the area 1003 by a predetermined distance.

Since the sizes of line width and gap space width are predefined by design data, it is also possible by the concavity/convexity determination to readily specify a pattern at a position which is moved by a predetermined distance from the pattern that was identified by the concavity/convexity determination.

Figure 11:
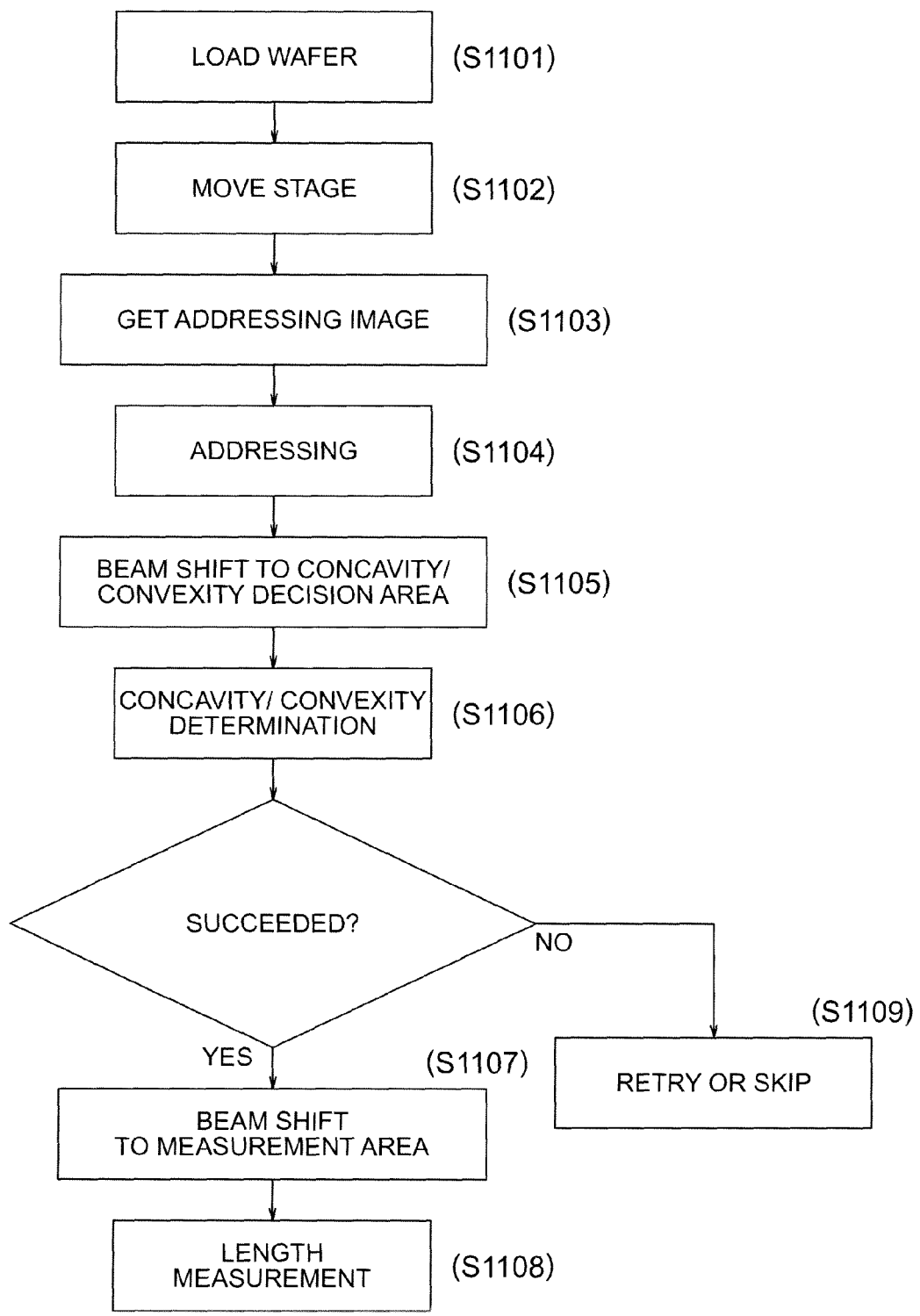
FIG. 11 is a flowchart showing a process for executing pattern length measurement through the concavity/convexity determination of line-and-space pattern.
Figure 12:
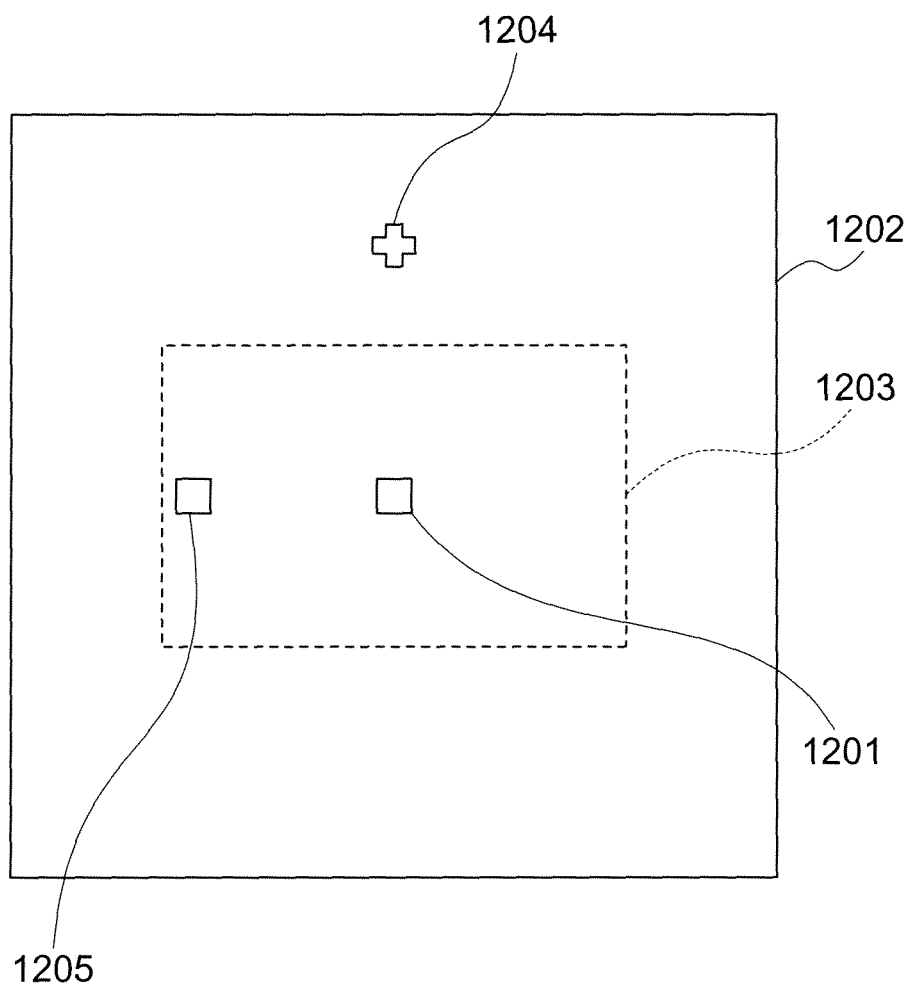
FIG. 12 is a diagram showing a positional relation of an addressing pattern, concavity/convexity decision area and measurement object area.

FIG. 11 is a flowchart showing a process of performing measurement based on the concavity/convexity determination. First, a wafer is introduced into a vacuum sample chamber (at step 1101). Then, the sample stage is driven to move the wafer so that its surface area to be measured is placed at a position immediately beneath the light axis of an electron beam (step 1102). FIG. 12 is a diagram showing the positional relationship between a measurement object area 1201 and concavity/convexity determination area 1205. In step 1102, the sample stage is moved so that the measurement area 1201 locates at a position below the electron beam's light axis. Next, an image of addressing area 1202 is acquired (step 1103), followed by execution of addressing (step 1104). In this addressing, the position of an addressing pattern 1204 is specified by template matching techniques using a pre-registered template. The addressing pattern 1204 lies outside of a line-and-space pattern fabrication area 1203. A specific pattern that is unique in shape has been selected therefor.

As the addressing pattern 1204 and the measurement object area 1201 are in a known positional relationship, it is possible by specifying the position of addressing pattern 1204 to accurately perform the view movement toward the measurement area 1201. In this embodiment, prior to moving the view to the measurement area, the view is shifted to the concavity/convexity decision area 1205, thereby executing concavity/convexity determination (at step 1106). Since the positional relation between the measurement area 1201 and concavity/convexity decision area 1205 is also known, the view movement of from the addressing pattern 1204 to concavity/convexity decision area 1205 is also executable based on the known information. In a case where the concavity/convexity determination is judged to be succeeded, the view is shifted to the measurement area 1201 (step 1107); then, execute length measurement (step 1108). If the concavity/convexity determination is failed, any one of the following corrective actions is taken (at step 1109): measurement is performed again; measurement is skipped; and, an error message is issued to prompt the system operator to take remedial action for avoiding occurrence of measurement interruption accidents.

With the above-stated arrangement, it becomes possible to perform the intended measurement based on accurate pattern identification by means of the concavity/convexity determination, without having to perform excessive bean irradiation onto the measurement object area 1201. Thus it is possible to reduce the risk of beam irradiation damages with respect to the object being measured, thereby suppressing the influence, such as sample shrink or the like. This leads to achievement of a technical advantage as to improvement in length measurement reproducibility.

Although the accuracy of the view movement by the deflector is high enough to enable execution of precise concavity/convexity determination as far as the positional relationship of patterns is approximate to that defined in the design data, undesired determination with half-pitch deviation can still be made, resulting in a line pattern being misjudged to be a gap space. In this respect, an example capable of attaining more accurate specifiability will be explained, which specifies a deviation of view field on a display screen for the concavity/convexity determination use and correct such deviation accurately to thereby situate the view in the measurement area.

Figure 13:
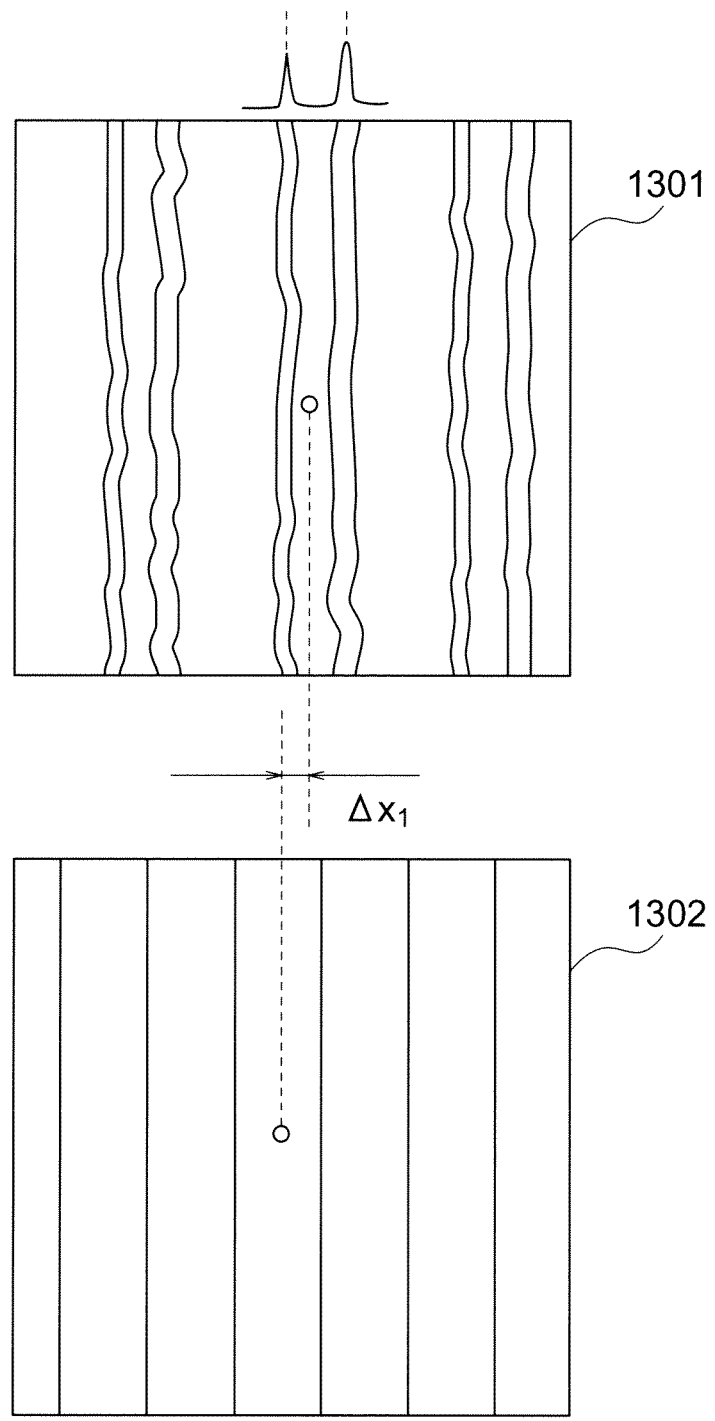
FIG. 13 is a diagram for explanation of an example which measures a deviance between an image of the concavity/convexity decision area and its design data.

This example is arranged so that the arithmetical unit evaluates a deviance between an image of concavity/convexity determination area and its corresponding design data and shifts the view field by a distance equivalent to such deviance during positioning of the view in the measurement area. FIG. 13 is a diagram showing a case where a concavity/convexity decision area image 1301 is deviated from its inherent view position. Comparing it to design data 1302 of pre-acquired concavity/convexity decision area reveals that the view is positioned at a location deviated by a distance $\Delta x_1$. In this state, when the view is moved by a predefined distance value toward the measurement area, it will possibly happen that the view of the length measurement area is deviated undesirably. This deviance is corrected for compensation by supplying the scroll deflector with a deflection signal for correcting the distance $\Delta x_1$. More precisely, processing is performed to obtain the position of a center of mass or "centroid" for a respective one of design data and real images. The resultant centroid positions are superposed together, thereby obtaining a deviance therebetween, from which is computed a deflection signal for correction of this deviance. This deviance compensation signal is then supplied to the deflector.

By performing deviance correction using an on-screen display image of the concavity/convexity decision area in the way stated above, it becomes possible to accurately locate a view field for the length measurement use at the exact position. The view position correction may be replaced with a process of adjusting the position of a length measurement box by a distance corresponding to the deviance stated supra.

Although in this embodiment the concavity/convexity determination is performed based on the information gained from the concavity/convexity decision area 1003, this may be modified in various ways, one example of which is as follows: another concavity/convexity decision area 1004 is provided to permit the decision of success in concavity/convexity determination to be made when it is verified that the both areas are consonant with each other in concavity/convexity determination results. Additionally, the concavity/convexity determination and the image acquisition of concavity/convexity decision area may be arranged so that these are performed after having acquired an image of length measurement object area and yet before execution of the length measurement.

Although the above-stated arrangement is the one that concerns concavity/convexity determination of patterns, autofocusing may also be implemented simultaneously during scanning of a concavity/convexity decision area (at step 1105).

Figures 15A, 15B:
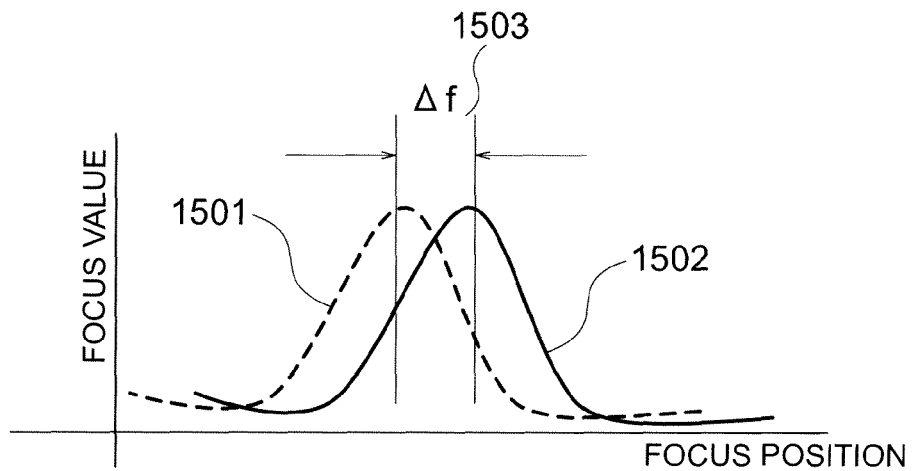
FIG. 15A is a graph showing a relation of focus value versus focus position; and, FIG. 15B is a diagram showing one example of a focus position correction table.

However, in the case of $\Delta x_1$ being large in value, a deviance $\Delta f$ 1503 takes place between a focus position 1501 of concavity/convexity decision area and a focus position 1502 of length measurement object area as shown in FIG. 15A.

In this case, in light of the fact that $\Delta x_1$ is a known value, a properly focused image is acquirable by preparing in advance a focus position correction table 1504 shown in FIG. 15B, which defines therein the focus position with $\Delta x_1$ and the deviance $\Delta f$ of focus of the length measurement object area, and then performing correction or "amendment" of the result of autofocusing performed in the concavity/convexity decision area.

By using the above-stated method, it is no longer necessary to perform the scanning for the autofocusing separately, thus making it possible to obtain an advantage as to improvement of throughput in addition to the improvement in accuracy of concavity/convexity determination.

Embodiment 3

The above-stated pattern distinguishing method using a tilted beam is employable not only for convexo-concave patterns, such as line-and-space patterns, but also for the specifying of circuit patterns that are fabricated by self-alignment double patterning (SADP) techniques.

Figure 6:
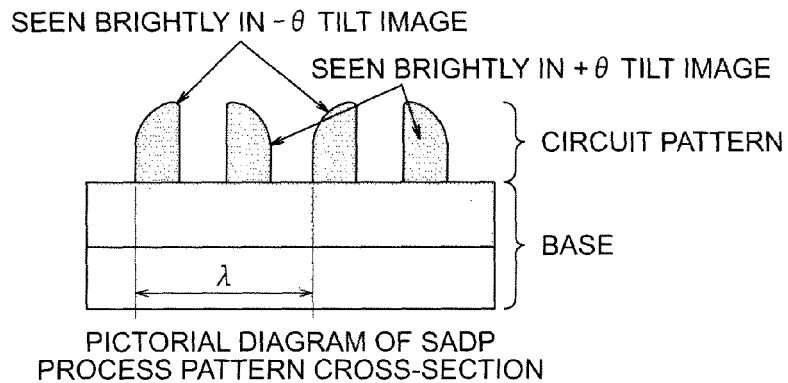
FIG. 6 is a diagram showing a cross-sectional view of a pattern fabricated through a self-alignment double patterning (SADP) step.
Figure 7A:
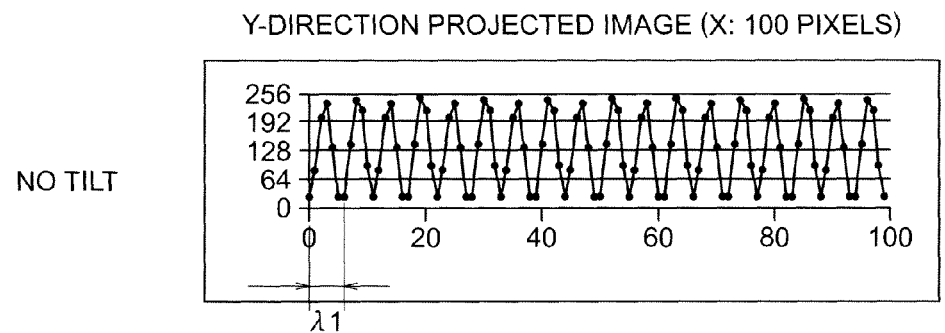
FIGS. 7A to 7C are diagrams each showing a profile of a sensed image of the SADP-formed pattern.
Figure 7B:
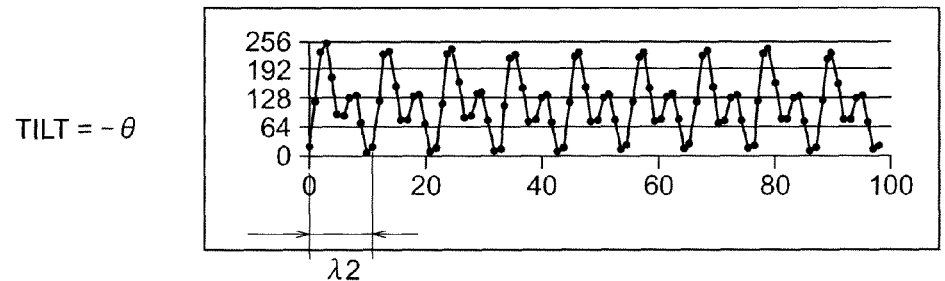
Figure 7C:
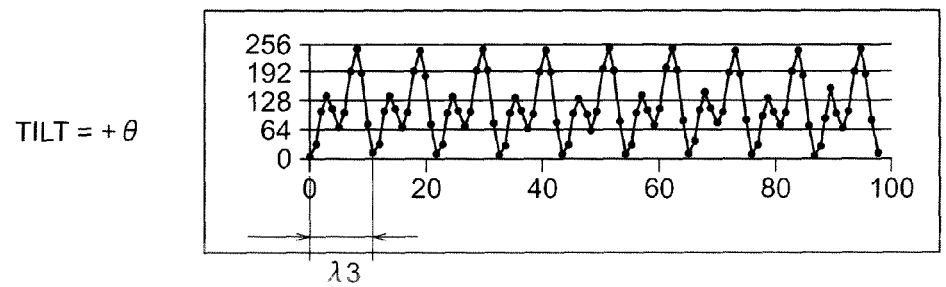

FIG. 6 shows a cross-sectional view of a pattern in SADP process step. A circuit pattern formed by the SADP process has multiple line segments, two adjacent ones of which make one set together in compliance with manufacturing process rules. This means that linear circuit pattern segments having the same cross-sectional shape appear alternately. For this reason, in order to measure pattern sizes properly, it is required to identify the period $\lambda$ of circuit pattern accurately. In FIGS. 7A to 7C, projection waveforms in Y-direction are shown, which are obtained when SADP-fabricated pattern is image-sensed while changing the tilt angle of an electron beam from zero to $-\theta$ and to $+\theta$. By changing the beam tilt angle by $\pm\theta$, the image's visual appearance varies depending on the pattern's rounded shape at its top portion. Looking at the pattern's period, the following relation is given: $2\times\lambda 1=\lambda 2=\lambda 3$.

Accordingly, it is possible by performing pattern measurement based on the oblique image acquisition and position detection, which have been discussed in the embodiments stated supra, to accurately perform the intended size measurement of one set of circuit patterns chosen as the length measurement object, without mistaking the measurement position.

Figure 14:
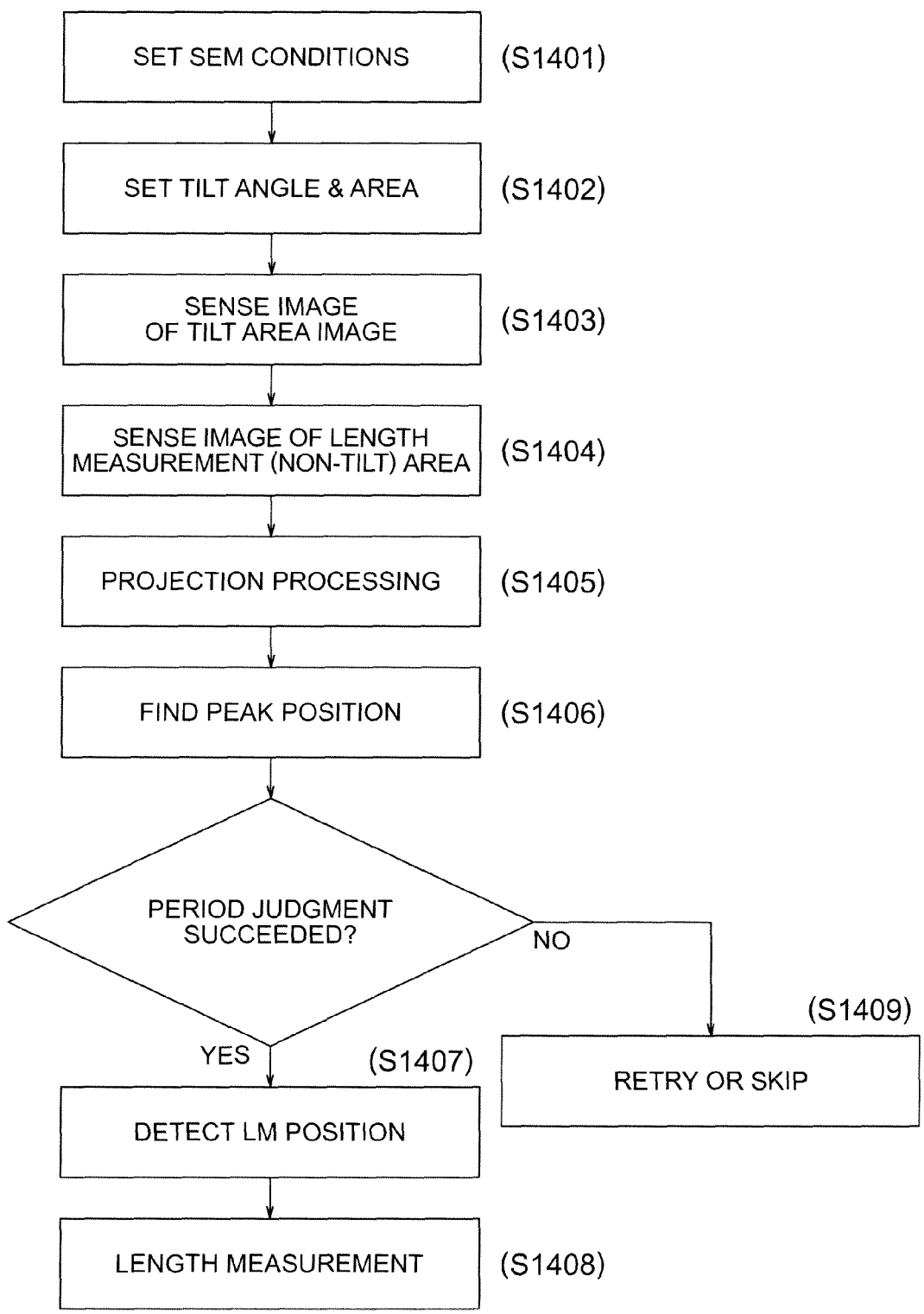
FIG. 14 is a flowchart showing a process of determining a pattern formed by SADP.

FIG. 14 is a flowchart of the processing for determining the period in SADP process. The above-stated embodiment method is used to acquire an oblique image and an obliquity-free image for use as the length measurement object (referred to hereinafter as the length measurement image) in steps 1401 to 1404. Then, at step 1405, projection processing is applied to each image, thereby obtaining the brightness profiles shown in FIGS. 7A-7C.

While in the embodiments 1-2 the concavity/convexity determination is performed using the half-value width of brightness profile, the SADP process is such that period judgment is performed using a peak value(s) of brightness profile and a position(s) thereof because of the fact that the visual brightness (luminance value) varies as shown in FIG. 6.

The oblique image's peak position is obtained with the length measurement image's peak value being as a reference. In case the oblique image and length measurement image are different in pixel number from each other, their native values are not directly usable for comparison. Therefore, this comparison is done after having applied normalization to the brightness profiles, followed by execution of peak position detection (step 1406).

The peak position detection may be performed by various methods other than the above-stated method, including self-correlation using a single oblique image and intercorrelation of two oblique images.

The SADP-formed pattern shown in FIG. 6 has gaps, including core gaps (i.e., gaps defined between upstanding sidewalls) and spacer gaps (gaps defined between slanted sidewalls). These two types of gaps are different in fabrication process from each other; so, measurement with wrong designation leads to the lack of an ability to perform proper process evaluation. For example, a peak which is observed brightly by the oblique image with tilt angle $-\theta$ is at the left edge of a core gap whereas a relatively darkly seen peak is at the right edge of core gap. Thus, it becomes possible to perform proper measurement of a target object, by specifying the type of a gap or the kind of pitch from a prestored relationship of tilt direction versus peak brightness.

In light of the fact that the interval of peak positions detected in each brightness profile is expected to have the periods $\lambda 1$, $\lambda 2$ and $\lambda 3$ as shown in FIGS. 7A-7C, in case the relation given by $2 \times \lambda 1 = \lambda 2 = \lambda 3$ does not work out, it is decided that the period judgment is failed. If this is the case, any one of the following actions is taken (at step 1409): measurement is performed again; measurement is skipped; an error message is displayed, thereby prompting the system operator to take corrective action to avoid measurement interruption.

Finally, a peak position of length measurement image that is the closest to the peak position of oblique image detected in step 1406 becomes at the measurement position of the length measurement object (at step 1407), followed by execution of length measurement (step 1408).

With the arrangement stated above, it is possible to perform measurement based on accurate pattern identification relying upon the cycle judgment which has been difficult by mere use of a length measurement image, without having to excessive beam irradiation onto the measurement object area.

It is needless to say that in this embodiment also, effects and advantages of the aforesaid embodiments are expectable.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern measuring apparatus, comprising:
an arithmetical unit configured to perform, by way of a programmed processor:
determining a pattern size by using a signal to be obtained based on scanning of a charged particle beam emitted from a charged particle source; and
a beam tilting deflector for irradiating the charged particle beam while tilting this beam with respect to an ideal light axis thereof,
wherein the arithmetical unit is configured to perform, by way of the programmed processor:
specifying a kind of a pattern formed on a sample based on a signal obtained by obliquely scanning the beam in an area of the sample being different from an area used to obtain the pattern size.

2. The pattern measuring apparatus according to claim 1, wherein the beam tilting deflector specifies the kind of a pattern formed on the sample based on a signal obtained when irradiating the tilted beam in an area in which is formed the same kind of pattern as that of the area used to obtain the pattern size.

3. The pattern measuring apparatus according to claim 1, wherein the beam tilting deflector deflects the charged particle beam in such a manner that the charged particle beam goes away from the light axis of an objective lens.

4. The pattern measuring apparatus according to claim 3, wherein the beam tilting deflector switches between a tilted state and a non-tilted state of the charged particle beam during scanning of a one frame by means of a scanning deflector which is for scanning the charged particle beam.

5. The pattern measuring apparatus according to claim 1, wherein the beam tilting deflector is a deflector for moving a visual field.

6. The pattern measuring apparatus according to claim 5, wherein the arithmetical unit specifies the kind of the pattern based on a signal obtained in an area with the visual field having been moved by a predetermined distance from the area in which the pattern size is obtained by the deflector for moving the visual field.

7. The pattern measuring apparatus according to claim 1, wherein the arithmetical unit determines whether the pattern formed on the sample is a line pattern or a space.

8. The pattern measuring apparatus according to claim 1, wherein the arithmetical unit determines whether the pattern formed on the sample is a core gap or a spacer gap.

9. A pattern measuring apparatus comprising:
an arithmetical unit configured to perform, by way of a programmed processor:
determining a pattern size by using a signal to be obtained based on scanning of a charged particle beam emitted from a charged particle source; and
a beam tilting deflector for irradiating the charged particle beam while tilting this beam with respect to an ideal light axis thereof,
wherein the arithmetical unit is configured to perform, by way of the programmed processor:
specifying a kind of a pattern formed on a sample based on a signal obtained by obliquely scanning the beam in an area of the sample being different from an area used to obtain the pattern size, thereby to measure the pattern thus specified.

10. The pattern measuring apparatus according to claim 9, wherein the arithmetical unit determines that the pattern formed on the sample is which one of a line, a space, a core gap and a spacer gap.

* * * * *